United States Patent
Zhang

(10) Patent No.: US 7,266,169 B2
(45) Date of Patent: Sep. 4, 2007

(54) PHASE INTERPOLATER AND APPLICATIONS THEREOF

(75) Inventor: Bo Zhang, Las Flores, CA (US)

(73) Assignee: Broadcom Corporation, Irvine, CA (US)

( * ) Notice: Subject to any disclaimer, the term of this patent is extended or adjusted under 35 U.S.C. 154(b) by 737 days.

(21) Appl. No.: 10/243,495

(22) Filed: Sep. 13, 2002

(65) Prior Publication Data

US 2004/0052323 A1   Mar. 18, 2004

(51) Int. Cl.
   *H03D 3/24* (2006.01)
(52) U.S. Cl. .................. 375/375; 375/354; 331/25; 331/27
(58) Field of Classification Search ............. 375/375, 375/327, 354; 327/165, 291; 331/25, 27
   See application file for complete search history.

(56) References Cited

U.S. PATENT DOCUMENTS

| | | | | |
|---|---|---|---|---|
| 6,043,717 | A * | 3/2000 | Kurd ........................... 331/17 |
| 6,125,157 | A * | 9/2000 | Donnelly et al. ............ 375/371 |
| 6,621,438 | B1 * | 9/2003 | Hong .......................... 341/144 |
| 6,799,131 | B1 * | 9/2004 | Steiner et al. .............. 702/107 |
| 6,859,109 | B1 * | 2/2005 | Leung et al. ................ 331/46 |
| 6,943,606 | B2 * | 9/2005 | Dunning et al. ............ 327/231 |
| 2002/0021775 | A1 * | 2/2002 | Dietl et al. ................ 375/354 |
| 2002/0109495 | A1 * | 8/2002 | Antone et al. ............. 324/76.54 |
| 2003/0002607 | A1 * | 1/2003 | Mooney et al. ............. 375/355 |
| 2003/0053565 | A1 * | 3/2003 | Yang et al. ................. 375/327 |
| 2004/0030513 | A1 * | 2/2004 | Kocaman et al. ............ 702/79 |
| 2004/0217790 | A1 * | 11/2004 | Saeki ........................ 327/158 |

FOREIGN PATENT DOCUMENTS

EP           0909035 A2  *  4/1999

* cited by examiner

*Primary Examiner*—Mohammed Ghayour
*Assistant Examiner*—Leila Malek
(74) *Attorney, Agent, or Firm*—Garlick Harrison & Markison

(57) ABSTRACT

A phase interpolator includes a plurality of clock phase input sections, a plurality of clock phase switching sections, a plurality of current sources and a load. Each of the clock phase input sections is coupled to receive one of a plurality of reference clock phases (e.g., 0°, 90°, 180°, and 270°). The plurality of current sources is selectively coupled to the plurality of clock phase input sections via the clock phase switching sections based on a phase control signal. The number of current sources corresponds to the phase granularity between the reference clock phases. The load is coupled to a phase adjusted clock signal in accordance with the phase control signal.

23 Claims, 7 Drawing Sheets phase interpolator 74 prior art phase interpolator optical interface 10 optical receiver 20 or 22 recovery circuit 30 desired phase alignment timing diagram of clock reference generator 78 phase interpolator functional operation phase interpolator 74 phase interpolator 74

PHASE INTERPOLATER AND APPLICATIONS THEREOF

BACKGROUND OF THE INVENTION

1. Technical Field of the Invention

This invention relates generally to data communications and more particularly to data recovery within such communication systems.

2. Description of Related Art

In general, broadband communications are high-speed (e.g., greater than 45 megabits-per-second) data transmissions within a wide area network (WAN). Typically, broadband communication systems are fiber optic in nature. For example, many broadband networks include fiber optic interfaces that are constructed in accordance with SONET (Synchronous Optical NETwork). As is known, SONET is an optical interface standard that allows internetworking of transmission products from multiple vendors and prescribed transmission rates from 51.84 megabits-per-second to over 10 gigabits-per-second.

As is further known, data transmissions via fiber optic links are serial streams of data, but within a network component (e.g., switch, relay, bridge, gateway, et cetera) the data is processed in parallel. As such, each network component includes a serial-deserial transceiver (i.e., transmitter and receiver). In general, the transmitter converts parallel data into serial data and sources the serial data onto a fiber optic link. A receiver receives serial data via a fiber optic link and converts it back into parallel data.

Needless to say, a critical function of the receiver is to accurately sample the received serial data to be able to produce the parallel data. While the data rates for fiber optic transmissions are specified, hence the required clock signals are also specified, the clocks of fiber optic transceivers are not synchronized. Thus, the phase and/or frequency of the transmitter sourcing the received serial data may not align with the clock signal of the receiver. Such a misalignment, if uncorrected, produce errors in the resulting parallel data. To correct the misalignment, receivers include a data and clock recovery circuit, which may include a phase locked loop (PLL) architecture or a delay locked loop (DLL) architecture.

DLL's are known to include a phase detector, loop filter and a phase interpolator. As is known, the phase detector determines a phase difference between the rate of the received serial data and the clock of the receiver. If a difference exists, the phase detector provides a signal to the loop filter, which produces a control signal therefrom. The phase interpolator processes the control signal to adjust the phase of the receiver's clock.

FIG. 1 is a schematic block diagram of a phase interpolator that is widely used in DLL's of various types of digital communication systems, including fiber optic networks. As shown, the phase interpolator employs several fixed clock phases (e.g., 0°, 90°, 180°, 270°) and creates a phase clock, which is between 0° and 360° with certain fixed steps. For example, the phase interpolator of FIG. 1 can produce 16 phases of a reference clock with steps corresponding to 360° divided by 16. The selection of a particular phase is based on the enablement of switches D0-D15.

As shown, each switch controls a current source that when enabled couples the current source to the output (e.g., the recovered clock signal) via a transistor. For example, if the desired phasing of the recovered clock signal is 0°, switches D0-D3 are enabled and the remaining switches are disabled. For a phase shift of 360° divided by 16, switches D1-D4 are enabled while D0 and D5-D15 are disabled. Accordingly, each phase step is achieved by enabling various combinations of the switches.

An issue with such a phase interpolator is that ¾ths of the current sources are shut-off and only ¼th of the current sources are used to establish the desired phase. In addition, when a phase change occurs, some current sources will be shut-off and some current sources will be turned on, which creates a glitch at the output thereby reducing the integrity of the recovered clock signal. Further, since all current sources have to be well matched to improve accuracy of the output phases, large sized transistors are used, which results in large die area for the phase interpolator. Accordingly, the die area of the corresponding DLL increases, which increases the overall cost and power consumption for data recovery circuits.

Therefore, a need exists for a more efficient data and clock recovery circuit for use in digital communication systems.

BRIEF SUMMARY OF THE INVENTION

The phase interpolator and applications thereof of the present invention substantially meets these needs and others. An embodiment of a phase interpolator includes a plurality of clock phase input sections, a plurality of clock phase switching sections, a plurality of current sources and a load. Each of the clock phase input sections is coupled to receive one of a plurality of reference clock phases (e.g., 0°, 90°, 180°, and 270°). The plurality of current sources is selectively coupled to the plurality of clock phase input sections via the clock phase switching sections based on a phase control signal. The number of current sources corresponds to the phase granularity between the reference clock phases. For example, if the reference clock phases include 0°, 90°, 180°, and 270° reference clocks and the desired phase granularity is 360°/16, then the number of current sources is four. The load is coupled to a phase adjusted clock signal in accordance with the phase control signal. By substantially reducing the number of current sources within a phase interpolator, the die area for the interpolator, the delay locked loop in which it is incorporated in is reduced thus reducing power consumption. In addition, since the each of the current sources will be activated, the glitches caused in the prior art phase interpolator of FIG. 1 are substantially avoided.

The phase interpolator may be incorporated in a data recovery circuit that also includes a phase detector and a loop filter. The phase detector is operably coupled to determine a phase difference between a reference clock signal and a data signal. The loop filter generates the phase control signal based on the phase difference between the reference clock signal and the data signal. The phase interpolator aligns the phase of the reference clock signal with the data signal based on the phase control signal. Such a data recovery circuit may be incorporated in an optical receiver.

DETAILED DESCRIPTION OF THE INVENTION

Figure 2:
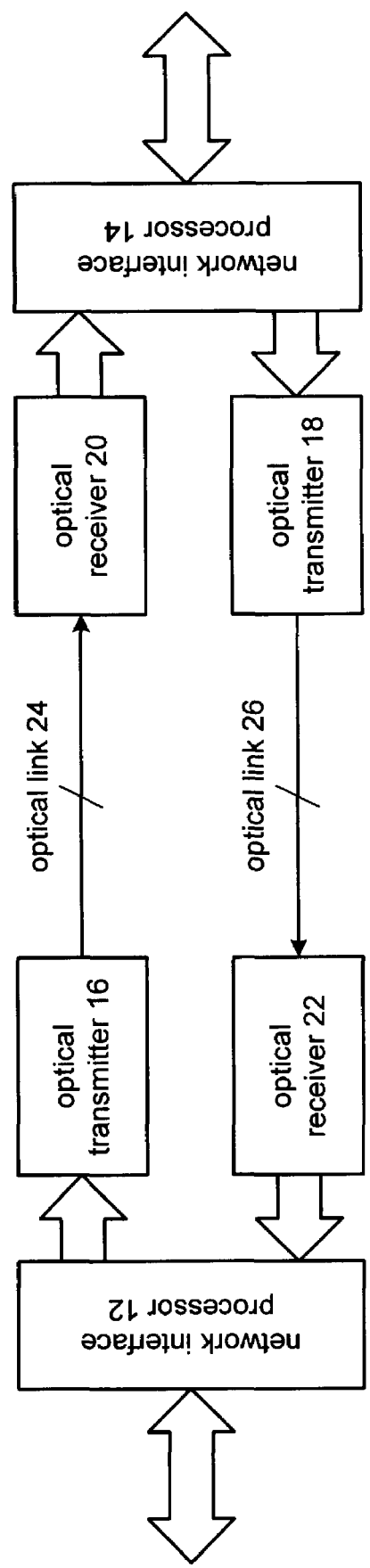
FIG. 2 is a schematic block diagram of an optical interface in accordance with the present invention.

FIG. 2 is a schematic block diagram of an optical interface 10 that includes network interface processors 12 and 14, optical transmitters 16 and 18, optical receivers 20 and 22 and optical links 24 and 26. Each optical link 24 and 26 may support one or more serial data streams at a rate specified by SONET or other fiber optic communication standard.

In general, data is transceived via the network interface processors 12 and 14, which may be included in a network component such as a switch, a bridge, a relay, a router, and/or any other type of network component used in fiber optic networks, the Internet, public switch telephone network, and/or any other wide area network or local area network. As shown, the data provided by network interface processor 12 to optical transmitter 16 is in a parallel format. The optical transmitter 16 converts the parallel data into a serial data that is transmitted via optical link 24. Optical receiver 20 receives the serial data and converts it back into parallel data, which is provided to network interface processor 14.

Similarly, network interface processor 14 provides parallel data to optical transmitter 18. Optical transmitter 18 converts the parallel data into serial data and communicates it via optical link 26 to optical receiver 22. Optical receiver 22 converts the serial data into parallel data and provides the parallel data to network interface processor 12.

As one of average skill in the art will appreciate, the optical interface 10 corresponds generally to any interface within any type of digital communication system that employs serial data transmission between devices. Accordingly, the optical links 24 and 26 may be replaced by radio frequency links, microwave links, wires, et cetera. Accordingly, the concepts of the present invention are equally applicable in optical communication systems as well as any other type of digital communication system.

Figure 3:
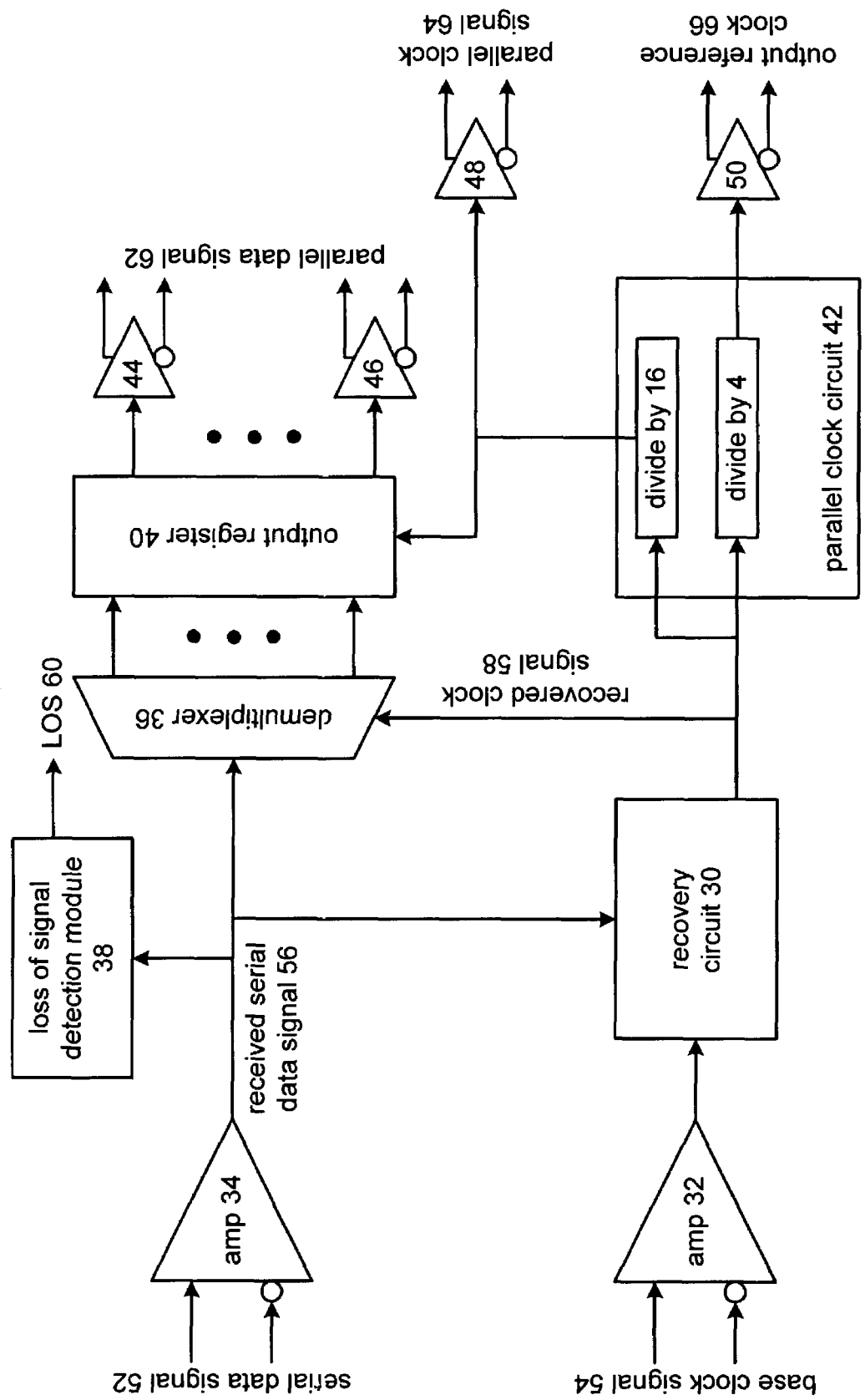
FIG. 3 is a schematic block diagram of an optical receiver in accordance with the present invention.

FIG. 3 is a schematic block diagram of optical receiver 20 or 22. As shown, the receiver 20 or 22 includes a recovery circuit 30, amplifiers 32 and 34, demultiplexor 36, loss of signal detection module 38, output register 40, parallel clock circuit 42 and a plurality of differential buffers 44-50. As shown, amplifier 32 is operably coupled to receive a differential base clock signal 54 and to provide it to the recovery circuit 30. Amplifier 34 receives a differential serial data signal 52 and provides it to the recovery circuit 30, the loss of signal detection module 38, and the demultiplexor 36 as the received serial data signal 56. As one of average skill in the art will appreciate, the amplifiers 32 and 34 may process single-ended signals as well.

The loss of signal detection module 38 determines whether the received serial data signal 56 is above a minimum signal strength threshold (e.g., greater than −85 dBm). If not, the loss of signal detection module 38 generates a loss of signal (LOS) indication 60. If the received serial data signal 56 is above the minimum required signal strength, the recovery circuit 30 generates a recovered clock signal 58 therefrom.

Based on the recovered clock signal 58, demultiplexor 36 converts the received serial data signal 56 into parallel data that is stored in output register 40. The output register 40 is buffered via a plurality of buffers 44-46 to provide the parallel data signal 62.

The parallel clock circuit 42 includes a divide by 16 module and may also include a divide by 4 module. The divide by 16 module receives the recovered clock signal 58 and produces a clock signal that is 1/16th the frequency of the recovered clock signal 58. This signal is provided to the output register 40 for clocking in the data produced by demultiplexor 36. Buffer 48 may provide a parallel clock signal 64 to devices outside of the optical receiver 20 or 22. Similarly, buffer 50 may provide a divide by 4 output reference clock 66 to devices outside the optical receiver 20. As one of average skill in the art will appreciate, the divider ratio for the divide by 16 module relates to the serial to parallel conversion. In this example, the serial bit stream is converted into 16-bit parallel data words. If another serial to parallel conversion ratio were used, the divider ratio of the divide by 16 module would change accordingly.

Figure 4:
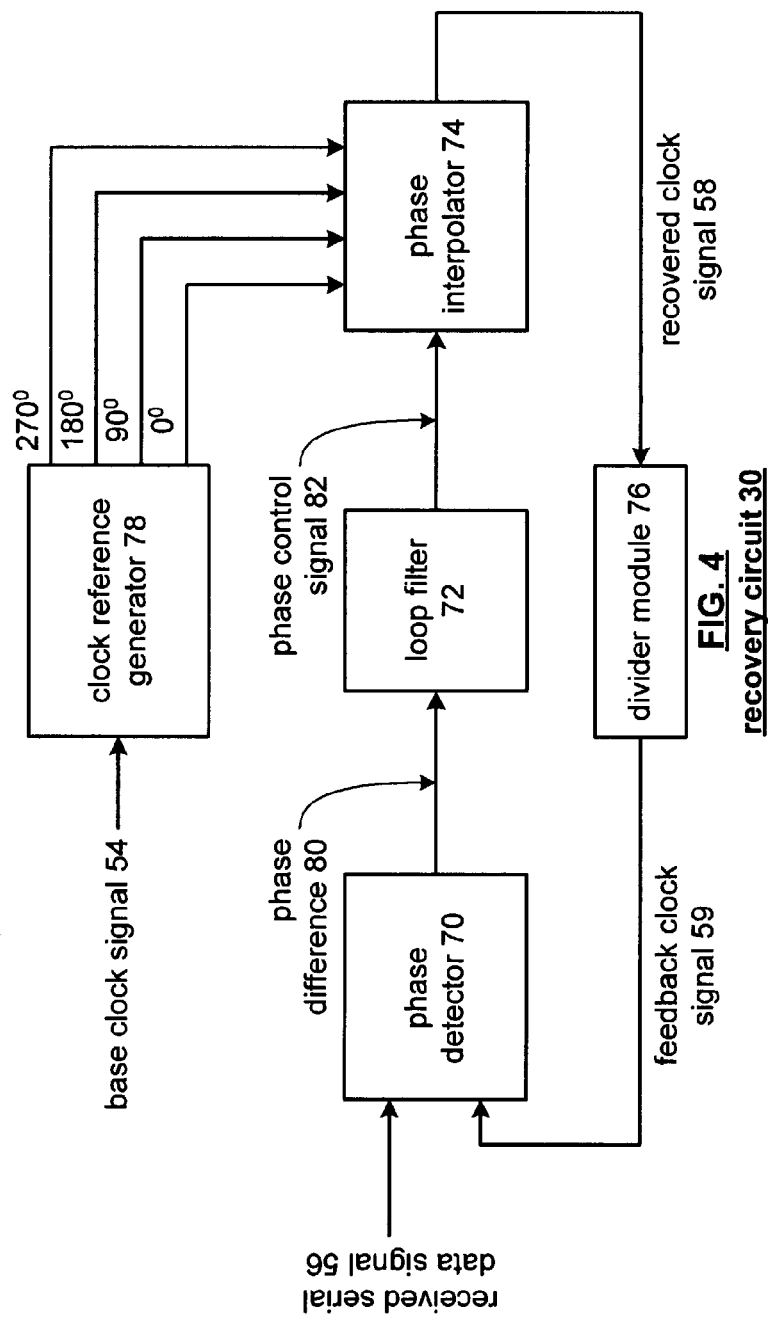
FIG. 4 is a schematic block diagram of a recovery circuit in accordance with the present invention.

FIG. 4 is a schematic block diagram of recovery circuit 30 that includes a phase detector 70, a loop filter 72, phase interpolator 74, divider module 76 and a clock reference generator 78. The phase detector 70, which may be a bang-bang phase detector, compares the received serial data signal 56 with a feedback clock signal 58. If a phase difference exists between the received serial data signal 56 and feedback clock signal 59, the phase detector 70 generates a phase difference signal 80.

The loop filter receives the phase difference 80 and produces a phase control signal 82 therefrom. The phase control signal 82 may be a multi-bit signal that is subsequently processed via the phase interpolator 74.

The phase interpolator 74 receives the phase control signal 82 and a plurality of reference clock phases from the clock reference generator 78. In this illustration, the clock reference generator 78 generates four reference clock phases (e.g., 0°, 90°, 180°, and 270°) from base clock signal 54. The generation of the phases will be further described with reference to FIG. 6. As one of average skill in the art will appreciate, more or less reference clock phases may be generated from base clock 54.

Based on the phase control signal 82, the phase interpolator 74 produces the recovered clock signal 58. The divider module 76 divides the recovered clock signal 58 to produce the feedback clock signal 59. If the divider module is a divide by 1 module, then the feedback clock signal 59 equals the recovery clock signal 58.

Figure 5:
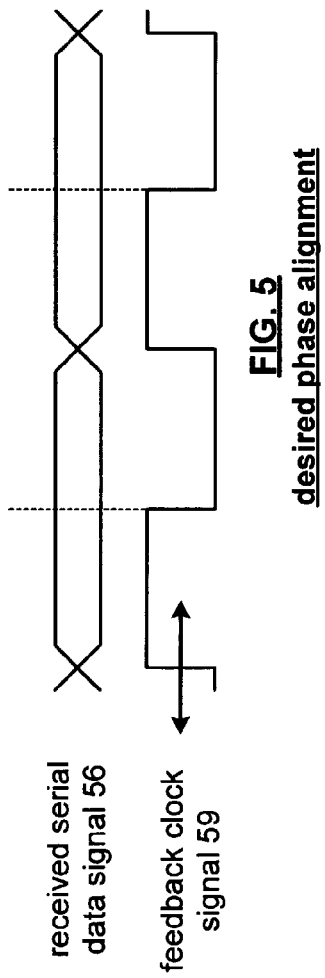
FIG. 5 is a timing diagram illustrating a desired phase alignment between a received serial data signal and a feedback clock signal in accordance with the present invention.

In general, the functionality of the recovery circuit 30 is to align the feedback clock signal 59 with the received serial data signal 56 to provide optimal sampling by the demultiplexor of the received serial data signal 56. An example of this is illustrated in FIG. 5. As shown, the received serial data signal 56 may be a logic-high or logic-low and may transition from cycle-to-cycle. The optimal sampling point of the received serial data signal 56 is in the center of the data (i.e., furthest in time away from the transition edges of the data). Accordingly, the feedback clock signal 59 is aligned to have its trailing edge, in this example, at approximately the center of the received serial data signal 56. Accordingly, to achieve this time alignment, the phase interpolator 74 shifts the recovered clock signal 58 and hence the feedback clock signal 59 to provide the desired alignment in accordance with the phase control signal 82.

Figure 6:
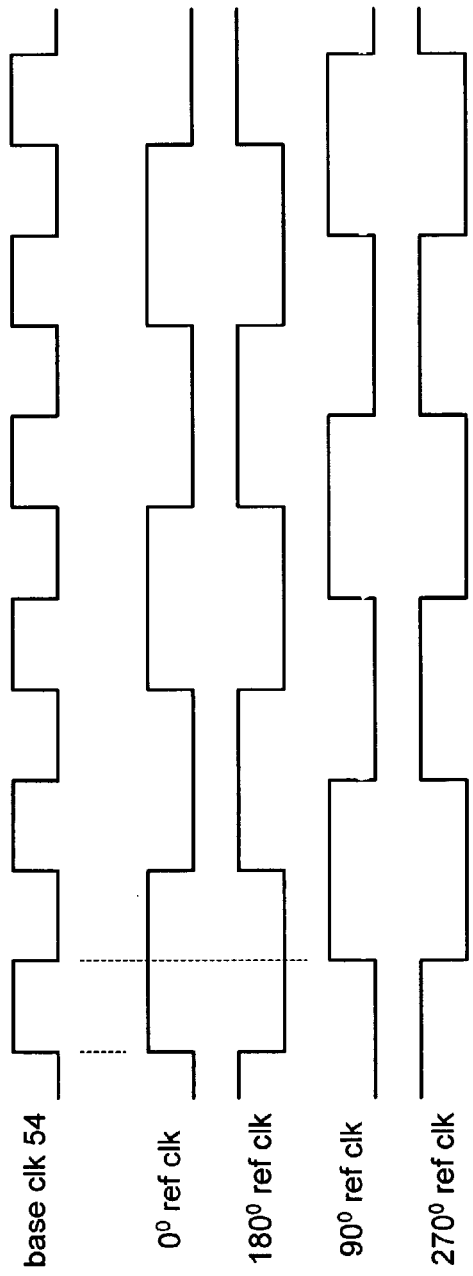
FIG. 6 is a timing diagram for producing the reference clock phases in accordance with the present invention.

FIG. 6 illustrates a timing diagram for producing the reference clock phases by clock reference generator 78. As shown, the base clock 54 is at a rate that is twice that of the reference clocks and hence twice the rate of the received serial data signal 56 in the example of FIG. 5. To generate the 0° reference clock phase, the base clock signal 54 is divided by 2 on the rising edge of the base clock 54. The 180° reference clock is produced by inverting the 0° reference clock. To produce the 90° reference clock, the base clock 54 is divided by 2 on the trailing edge of the base clock. The 270° reference clock is produced by inverting the 90° reference clock.

Figure 7:
FIG. 7 is a graphical representation of the functional operation of a phase interpolator in accordance with the present invention.

FIG. 7 is a graphical representation of the functionality of the phase interpolator of FIG. 4. As shown, to produce a resulting recovered clock signal 58 to have a 0° phase shift, all of the energy producing the recovered clock signal 58 is produced by the 0° reference clock. As such, all other reference clocks are disabled from providing energy. To produce a 90° phase shift clock, all the energy producing the recovered clock signal 58 is provided by the 90° reference clock. To produce a phase shift between 0° and 90°, a combination of energy from the 0° reference clock and from the 90° reference clock is utilized. For example, to produce a 45° shift, an equal amount of energy from the 0° reference clock and the 90° reference clock is used. To produce a phase shift that is less than 45°, but greater than 0°, more energy is provided from the 0° reference clock than from the 90° reference clock. Conversely, to provide a phase shift greater than 45° but less than 90°, the energy provided by the 90° reference clock is greater than the energy provided by the 0° reference clock. By scaling the energies produced by the 0° reference clock and 90° reference clock in this manner, any desired phase shift may be achieved. As one of average skill in the art will appreciate, similar phase shifting between 90° and 180°, between 180° and 270° and between 270° and 0° may be obtained. As one of average skill in the art will further appreciate, the phase granularity between 0° and 90° may be more or less than the 3 points shown. In addition, the reference phase clocks may be different than 0°, 90°, 180° and 270°. For example, the reference clocks may be 0°, 120° and 240°.

Figure 8:
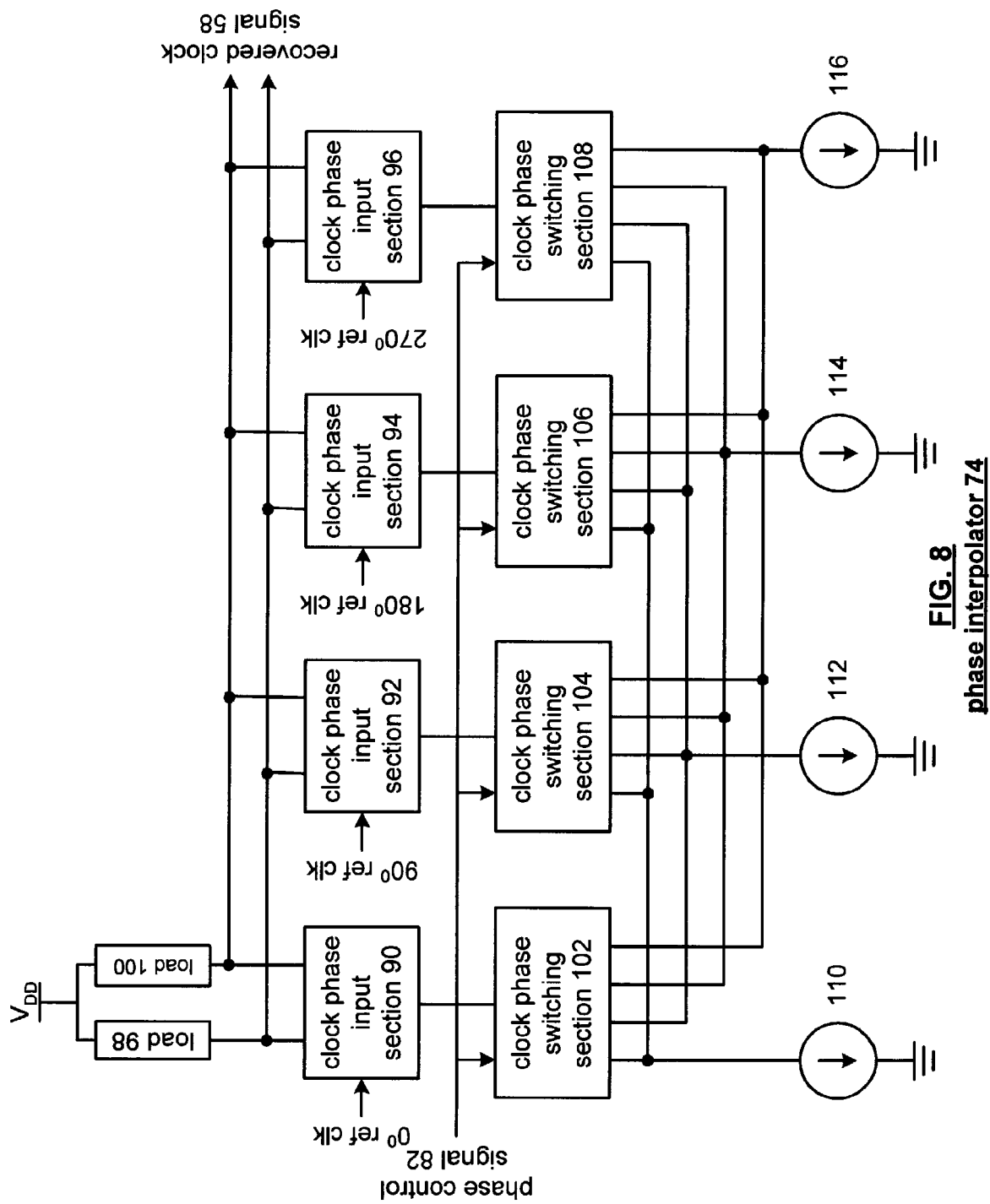
FIG. 8 is a schematic block diagram of a phase interpolator in accordance with the present invention.

FIG. 8 is a schematic block diagram of an embodiment of phase interpolator 74. In this embodiment, the phase interpolator 74 includes a plurality of clock phase input sections 90-96, a plurality of clock phase switching sections 102-108, a plurality of current sources 110-116 and loads 98 and 100. The loads may be resistors, transistors and/or any other device to supply a current from a voltage source.

In this example, clock phase input section 90 is operably coupled to receive the 0° reference clock, clock phase input section 92 is operably coupled to receive the 90° reference clock, clock phase input section 94 is operably coupled to receive the 180° reference clock, and clock phase input section 96 is operably coupled to receive the 270° reference clock. Note that the number of current sources corresponds to the desired granularity between the reference clocks. In this example, by utilizing 4 current sources, the desired granularity is 4 per quadrant (e.g., from 0 to 90, from 90 to 180, from 180 to 270, and from 270 to 0). If greater granularity were desired, more current sources would be included, if less granularity were desired, less current sources would be utilized.

The clock phase switching sections 102-108 are enabled based on the phase control signal 82. Accordingly, based on the phase control signal 82 each current source is coupled to one of the clock phase switching sections 102-108. For example, if the desired phase of the recovery clock signal 58 is 0°, the phase control signal 82 enables clock phase switching section 102 to couple all the current sources 110-116 to the clock phase input section 90 (i.e., the input section coupled to the 0° reference clock) such that all of the energy making up the recovered clock signal 58 is coming from the 0° reference clock. If the 1$^{st}$ level of phase shifting (e.g., 360/16) is desired, then the phase control signal 82 enables the clock phase switching section 102 to couple to current sources 110-114 and enables clock phase switching section 104 to couple to current source 116. As one of average skill in the art will appreciate, the magnitude of the current produced by current sources 110-116 may be the same or scaled to provide a desired phase shift granularity.

Figure 1:
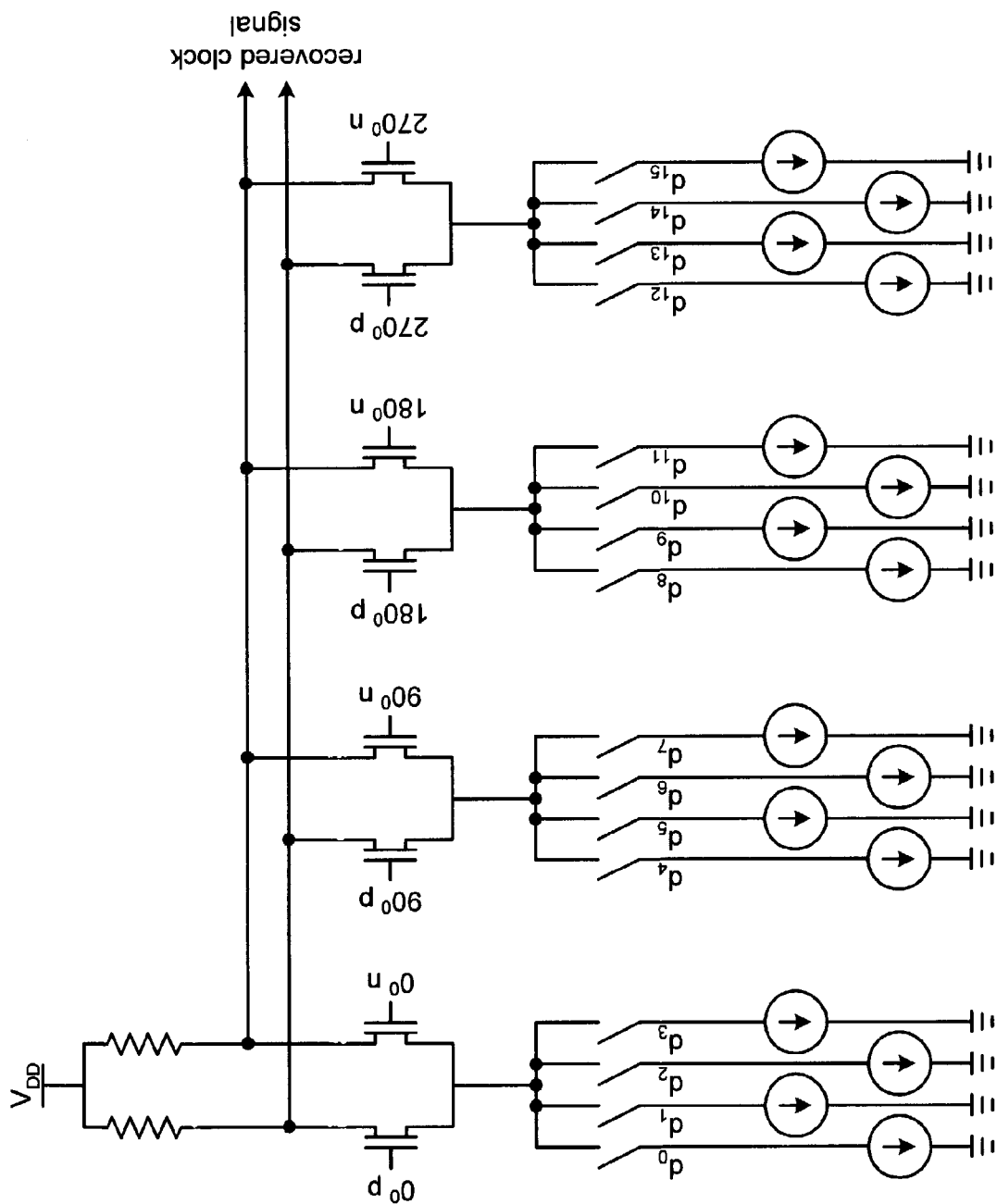
FIG. 1 is a schematic block diagram of a prior art phase interpolator.
Figure 9:
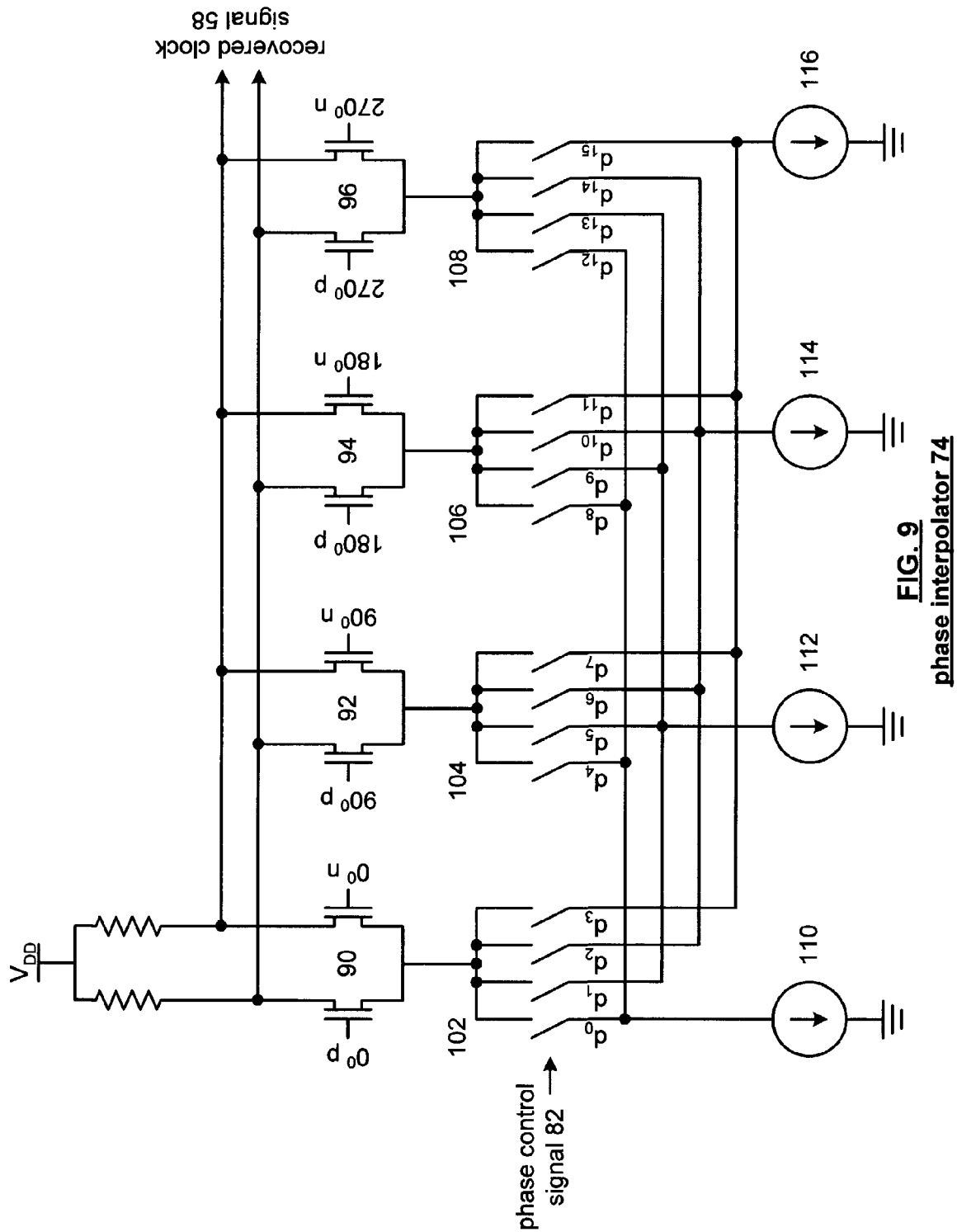
FIG. 9 is a schematic block diagram of an alternate phase interpolator in accordance with the present invention.

FIG. 9 is a schematic block diagram of an alternate phase interpolator 74. As shown, the phase interpolator 74 includes a plurality of switches $d_0$-$d_{15}$, transistor sections 90, 92, 94 and 96, and current sources 110-116. The switches $d_0$-$d_{15}$ may be transistors, switches and/or any other tri-stating device that are controlled via the phase control signal 82. Accordingly, by enabling 4 of the switches, the desired phase shifting of the recovered clock signal 58 may be obtained. In addition, by only utilizing 4 current sources in this example, the die area in comparison to the example of FIG. 1 is substantially reduced as well as power consumption. In addition, glitches that may result in the circuit of FIG. 1 are overcome in the phase interpolator of FIG. 9.

The preceding discussion has presented a phase interpolator that may be used in a data recovery circuit of a high-speed serial receiver. By reducing the number of current sources and providing optimal coupling thereof, die area is reduced, as such, power consumption is reduced, and glitches, which provided undesirable performance are substantially avoided. As one of average skill in the art will appreciate, other embodiments may be derived from the teaching of the present invention, without deviating from the scope of the claims.

What is claimed is:

1. A phase interpolator comprises:
   plurality of clock phase input sections, wherein each of the plurality of clock phase input sections is coupled to receive one of a plurality of reference clock phases;
   plurality of clock phase switching sections operably coupled to the plurality of clock phase input sections;
   plurality of current sources operably coupled to the plurality of clock phase input sections via the plurality of clock phase switching sections based on a phase control signal having multiple bits, wherein a total number of current sources determines a phase granularity selected between the reference clock phases, wherein each of the current sources is to be switched to one or more corresponding clock phase switching sections based on a particular phase of the phase granularity identified by the phase control signal, but in which all of the plurality of current sources are switched on through one or two clock phase switching sections at any particular phase of the phase granularity; and
   load coupled to the plurality of clock phase input sections to receive current from all of the plurality of current sources at each phase granularity to provide a phase adjusted clock signal.

2. The phase interpolator of claim 1, wherein each of the plurality of clock phase input section further comprises:
   first input transistor having a gate, a drain and a source, wherein the gate of the first input transistor is operably coupled to receive a positive leg of a corresponding one of the plurality of reference clock phases and the drain of the first input transistor is coupled to the load; and second input transistor having a gate, a drain, and a source, wherein the gate of the second input transistor is operably coupled to receive a negative leg of the corresponding one of the plurality of reference clock phases, the drain of the second input transistor is coupled to the load, and the sources of the first and second input transistors are operably coupled to the corresponding one of the plurality of clock phase switching sections.

3. The phase interpolator of claim 1, wherein each of the plurality of clock phase switching sections further comprises:

a plurality of switching elements, wherein each of the plurality of switching elements is operably coupled to a corresponding one of the plurality of current sources, and wherein the each of the plurality of switching elements is activated via at least one bit of the phase control signal.

4. The phase interpolator of claim 1, wherein the load comprises a pair of resistors.

5. The phase interpolator of claim 1 further comprises:

clock reference generator to generate the plurality of reference clock phases by:

generating a base clock signal having a frequency twice the desired frequency of the plurality of reference clock phases;

dividing frequency of the base clock signal by two on the rising edge of the base clock signal to produce a zero phase clock reference signal and a 180° phase clock signal of the plurality of reference clock phases; and dividing the frequency of the base clock signal by two on the falling edge of the base clock signal to produce a 90° phase clock reference signal and a 270° phase clock reference signal of the plurality of reference clock phases.

6. The phase interpolator of claim 1, wherein each of the plurality of current sources further comprises a current source providing a desired current value.

7. The phase interpolator of claim 1, wherein the plurality of current sources further comprises:

a first current source providing a first current value;

a second current source providing a second current value;

a third current source providing a third current value; and a fourth current source providing a fourth current value, wherein a ratio between the first, second, third, and fourth current values provides substantially equal divisions of phase between two of the plurality of reference clock phases.

8. A recovery circuit comprises:

phase detector to determine a phase difference between a feedback clock signal and a data signal;

loop filter operably coupled to the phase detector to generate a phase control signal, having multiple bits, based on the phase difference between the feedback clock signal and the data signal detected by the phase detector; and phase interpolator operably coupled to the loop filter to phase align the feedback clock signal and the data signal based on the phase control signal, wherein the feedback clock signal is based on a recovered clock of the data signal, and wherein the phase interpolator includes:

plurality of clock phase input sections, wherein each of the plurality of clock phase input sections is coupled to receive one of a plurality of reference clock phases;

plurality of clock phase switching sections operably coupled to the plurality of clock phase input sections;

plurality of current sources operably coupled to the plurality of clock phase input sections via the plurality of clock phase switching sections based on the phase control signal, wherein a total number of current sources determines a phase granularity selected between the reference clock phases, wherein each of the current sources is to be switched to one or more corresponding clock phase switching sections based on a particular phase of the phase granularity identified by the phase control signal, but in which all of the plurality of current sources are switched on through one or two clock phase switching sections at any particular phase of the phase granularity; and load coupled to the plurality of clock phase input sections to receive current from all of the plurality of current sources at each phase granularity to provide the recovered clock signal.

9. The data recovery circuit of claim 8, wherein each of the plurality of clock phase input section further comprises:

first input transistor having a gate, a drain and a source, wherein the gate of the first input transistor is operably coupled to receive a positive leg of a corresponding one of the plurality of reference clock phases and the drain of the first input transistor is coupled to the load; and second input transistor having a gate, a drain, and a source, wherein the gate of the second input transistor is operably coupled to receive a negative leg of the corresponding one of the plurality of reference clock phases, the drain of the second input transistor is coupled to the load, and the sources of the first and second input transistors are operably coupled to the corresponding one of the plurality of clock phase switching sections.

10. The data recovery circuit of claim 8, wherein each of the plurality of clock phase switching sections further comprises:

a plurality of switching elements, wherein each of the plurality of switching elements is operably coupled to a corresponding one of the plurality of current sources, and wherein the each of the plurality of switching elements is activated via at least one bit of the phase control signal.

11. The data recovery circuit of claim 8, wherein the load comprises a pair of resistors.

12. The data recovery circuit of claim 8 further comprises:

clock reference generator to generate the plurality of reference clock phases by:

generating a base clock signal having a frequency twice the desired frequency of the plurality of reference clock phases;

dividing frequency of the base clock signal by two on the rising edge of the base clock signal to produce a zero phase clock reference signal and a 180° phase clock signal of the plurality of reference clock phases; and dividing the frequency of the base clock signal by two on the falling edge of the base clock signal to produce a 90° phase clock reference signal and a 270° phase clock reference signal of the plurality of reference clock phases.

13. The data recovery circuit of claim 8, wherein each of the plurality of current sources further comprises a current source providing a desired current value.

14. The data recovery circuit of claim 8, wherein the plurality of current sources further comprises:
   a first current source providing a first current value;
   a second current source providing a second current value;
   a third current source providing a third current value; and
   a fourth current source providing a fourth current value, wherein a ratio between the first, second, third, and fourth current values provides substantially equal divisions of phase between two of the plurality of reference clock phases.

15. A receiver comprises:
   recovery circuit to recover a clock signal from a received serial data signal, wherein the data recovery circuit includes:
      phase detector to determine a phase difference between a feedback clock signal and the received serial data signal;
      loop filter operably coupled to the phase detector to generate a phase control signal, having multiple bits, based on the phase difference between the feedback clock signal and the serial data signal detected by the phase detector; and
      phase interpolator operably coupled to the loop filter to phase align the feedback clock signal and the serial data signal based on the phase control signal, wherein the feedback clock is based on the recovered clock signal, and wherein the phase interpolator includes:
         plurality of clock phase input sections, wherein each of the plurality of clock phase input sections is coupled to receive one of a plurality of reference clock phases;
         plurality of clock phase switching sections operably coupled to the plurality of clock phase input sections;
         plurality of current sources operably coupled to the plurality of clock phase input sections via the plurality of clock phase switching sections based on the phase control signal, wherein a total number of current sources determines a phase granularity selected between the reference clock phases, wherein each of the current sources is to be switched to one or more corresponding clock phase switching sections based on a particular phase of the phase granularity identified by the phase control signal, but in which all of the plurality of current sources are switched on through one or two clock phase switching sections at any particular phase of the phase granularity; and
         load coupled to the plurality of clock phase input sections to receive current from all of the plurality of current sources at each phase granularity to provide the recovered clock signal;
   demultiplexer operably coupled to receive the serial data signal and convert the received serial data signal into a parallel data signal; and
   parallel clock circuit operably coupled to the recovery circuit to produce a parallel clock signal from the recovered clock signal.

16. The receiver of claim 15 further comprises:
   a loss of signal detection module operably coupled to the data recovery circuit to detect when the received serial data signal is below an acceptable signal strength level.

17. The receiver of claim 15 further comprises:
   an output register operably coupled to the demultiplexer to temporarily store the parallel data signal based on the parallel clock signal.

18. The receiver of claim 15, wherein each of the plurality of clock phase input section further comprises:
   first input transistor having a gate, a drain and a source, wherein the gate of the first input transistor is operably coupled to receive a positive leg of a corresponding one of the plurality of reference clock phases and the drain of the first input transistor is coupled to the load; and
   second input transistor having a gate, a drain, and a source, wherein the gate of the second input transistor is operably coupled to receive a negative leg of the corresponding one of the plurality of reference clock phases, the drain of the second input transistor is coupled to the load, and the sources of the first and second input transistors are operably coupled to the corresponding one of the plurality of clock phase switching sections.

19. The receiver of claim 15, wherein each of the plurality of clock phase switching sections further comprises:
   a plurality of switching elements, wherein each of the plurality of switching elements is operably coupled to a corresponding one of the plurality of current sources, and wherein the each of the plurality of switching elements is activated via at least one bit of the phase control signal.

20. The receiver of claim 15, wherein the load comprises a pair of resistors.

21. The receiver of claim 15 further comprises:
   clock reference generator to generate the plurality of reference clock phases by:
      generating a base clock signal having a frequency twice the desired frequency of the plurality of reference clock phases;
      dividing frequency of the base clock signal by two on the rising edge of the base clock signal to produce a zero phase clock reference signal and a 180° phase clock signal of the plurality of reference clock phases; and
      dividing the frequency of the base clock signal by two on the falling edge of the base clock signal to produce a 90° phase clock reference signal and a 270° phase clock reference signal of the plurality of reference clock phases.

22. The receiver of claim 15, wherein each of the plurality of current sources further comprises a current source providing a desired current value.

23. The receiver of claim 15, wherein the plurality of current sources further comprises:
   a first current source providing a first current value;
   a second current source providing a second current value;
   a third current source providing a third current value; and
   a fourth current source providing a fourth current value, wherein a ratio between the first, second, third, and fourth current values provides substantially equal divisions of phase between two of the plurality of reference clock phases.

* * * * *